US009406586B2

(12) United States Patent
Suzuki et al.

(10) Patent No.: US 9,406,586 B2
(45) Date of Patent: Aug. 2, 2016

(54) COOLING JACKET AND ELECTRONIC DEVICE HAVING THE SAME

(75) Inventors: Masumi Suzuki, Kawasaki (JP);
Michimasa Aoki, Kawasaki (JP);
Yosuke Tsunoda, Kawasaki (JP);
Masaru Sugie, Kawasaki (JP);
Shinichirou Kouno, Kawasaki (JP);
Hiroshi Muto, Kawasaki (JP); Kenji Katsumata, Kawasaki (JP)

(73) Assignee: FUJITSU LIMITED, Kawasaki (JP)

( * ) Notice: Subject to any disclaimer, the term of this patent is extended or adjusted under 35 U.S.C. 154(b) by 1089 days.

(21) Appl. No.: 13/073,394

(22) Filed: Mar. 28, 2011

(65) Prior Publication Data

US 2011/0272121 A1    Nov. 10, 2011

(30) Foreign Application Priority Data

May 10, 2010    (JP) .................................. 2010-108454

(51) Int. Cl.
| F28D 15/00 | (2006.01) |
| H01L 23/473 | (2006.01) |
| F28F 1/22 | (2006.01) |
| F28F 3/12 | (2006.01) |
| F28D 15/02 | (2006.01) |

(52) U.S. Cl.
CPC .............. *H01L 23/473* (2013.01); *F28D 15/00* (2013.01); *F28F 1/22* (2013.01); *F28F 3/12* (2013.01); *F28D 15/0266* (2013.01); *H01L 2924/0002* (2013.01)

(58) Field of Classification Search
CPC ............ H01L 23/473; F28F 3/12; F28F 1/00; F28F 1/22; F28F 7/02; F28D 15/00; F28D 15/0266; Y10T 29/49373

USPC .................. 165/104.19, 104.28, 104.33, 168
See application file for complete search history.

(56) References Cited

U.S. PATENT DOCUMENTS

| 7,388,746 B2* | 6/2008 | Park .................... H01L 23/4006 165/80.4 |
| 2006/0272802 A1* | 12/2006 | Sakayori et al. .............. 165/170 |
| 2007/0240867 A1* | 10/2007 | Amano et al. ................ 165/168 |
| 2009/0065178 A1 | 3/2009 | Kasezawa et al. |

FOREIGN PATENT DOCUMENTS

| JP | 2001-035981 A | 2/2001 |
| JP | 2006-324647 A | 11/2006 |
| JP | 2008-016718 A | 1/2008 |
| JP | 2008-205372 A | 9/2008 |
| JP | 2008-294197 A | 12/2008 |
| JP | 2008294197 A | * 12/2008 |

(Continued)

OTHER PUBLICATIONS

JP 2008294197 A May 3, 2015.*

(Continued)

*Primary Examiner* — Marc Norman
*Assistant Examiner* — Jon T Schermerhorn
(74) *Attorney, Agent, or Firm* — Westerman, Hattori, Daniels & Adrian, LLP

(57) ABSTRACT

A cooling jacket includes: first and second pipe portions through which a coolant flows; and a main portion connected with side surfaces of the first and second pipe portions, defining, with a single member, a flow path through which the coolant flows, and cooling an object to be cooled.

7 Claims, 10 Drawing Sheets

(56) References Cited

FOREIGN PATENT DOCUMENTS

| JP | 2009-206271 A | 9/2009 |
|----|---------------|--------|
| JP | 2009-260058 A | 11/2009 |
| TW | M281392 U | 11/2005 |

OTHER PUBLICATIONS

JP 2008294197 A translation May 3, 2015.*

Taiwanese Office Action dated Aug. 19, 2013, issued in corresponding Taiwan application No. 100110747, with English translation of summary.

Chinese Office Action dated Jul. 2, 2013, issued in corresponding Chinese Patent Application No. 201110109149.X, w/English translation.

Japanese Office Action dated Dec. 3, 2013, issued in Japanese Patent Application No. 2010-108454, w/English translation, (4 pages).

* cited by examiner

COOLING JACKET AND ELECTRONIC DEVICE HAVING THE SAME

CROSS-REFERENCE TO RELATED APPLICATIONS

This application is based upon and claims the benefit of priority of the prior Japanese Patent Application No. 2010-108454, filed on May 10, 2010, the entire contents of which are incorporated herein by reference.

FIELD

The embodiments discussed herein are related to a cooling jacket and an electronic device having the same.

BACKGROUND

The cooling jacket for cooling a heating element includes: a main portion including plural fins for defining a passageway through which a coolant flows; and a cover covering the main portion. The cover portion abuts the ends of plural fins to be attached to the main portion. Technologies relating to a cooling jacket are disclosed in Japanese Unexamined Patent Application Publication Nos. 2006-324647, 2001-35981, and 2009-206271.

As mentioned above, the cooling jacket is made of two members. Therefore, a gap may be generated between the ends of the fins and the cover portion. When the coolant flows through the gap between the ends of the fins and the cover portion, the flow rate of the coolant which should originally flow between the fins may decrease. Accordingly, the cooling efficiency may decrease.

SUMMARY

According to an aspect of the embodiments, a cooling jacket includes: first and second pipe portions through which a coolant flows; and a main portion connected with side surfaces of the first and second pipe portions, defining, with a single member, a flow path through which the coolant flows, and cooling an object to be cooled.

The object and advantages of the invention will be realized and attained by means of the elements and combinations particularly pointed out in the claims.

It is to be understood that both the foregoing general description and the following detailed description are exemplary and explanatory and are not restrictive of the invention, as claimed.

DESCRIPTION OF EMBODIMENTS

First Embodiment

Figure 1:
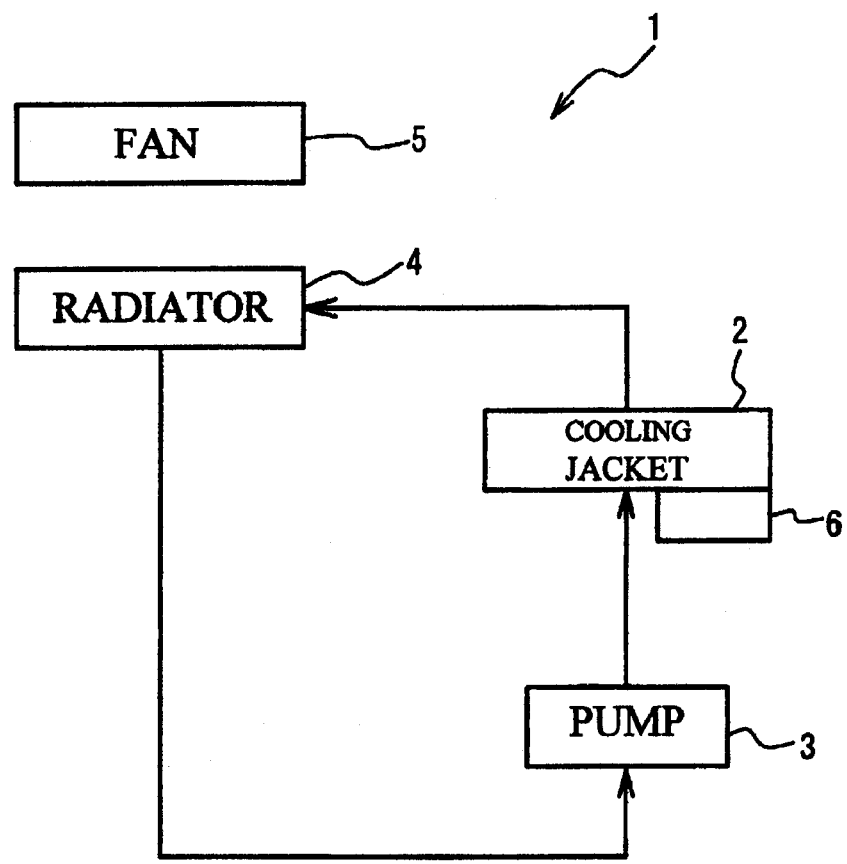
FIG. 1 is a block diagram of an electronic device.

FIG. 1 is a block diagram of an electronic device. For example, the electronic device 1 is an information processor such as a server, a desktop computer, or a notebook computer. The electronic device 1 includes a cooling system for cooling a heating part 6. For example, the heating part 6 is an electronic part such as a CPU, and develops heat in response to power supply. The cooling system includes a cooling jacket 2, a pump 3, a radiator 4, and a fan 5. The coolant circulates through this cooling system. The cooling jacket 2 is arranged to contact the heating part 6, and receives the heat therefrom to transmit the heat to the coolant. The pump 3 circulates the coolant therethrough. The radiator 4 receives the heat of the coolant and then releases the heat into air. The fan 5 sends air to the radiator 4. Each device is connected via a metallic pipe or a flexible hose. For example, antifreeze liquid such as propylene glycol is employed as the coolant. However, the coolant is not limited to this. Additionally, FIG. 1 illustrates an example of the cooling jacket 2. However, plural cooling jackets 2 may be arranged on the passageway of the coolant.

Figure 2:
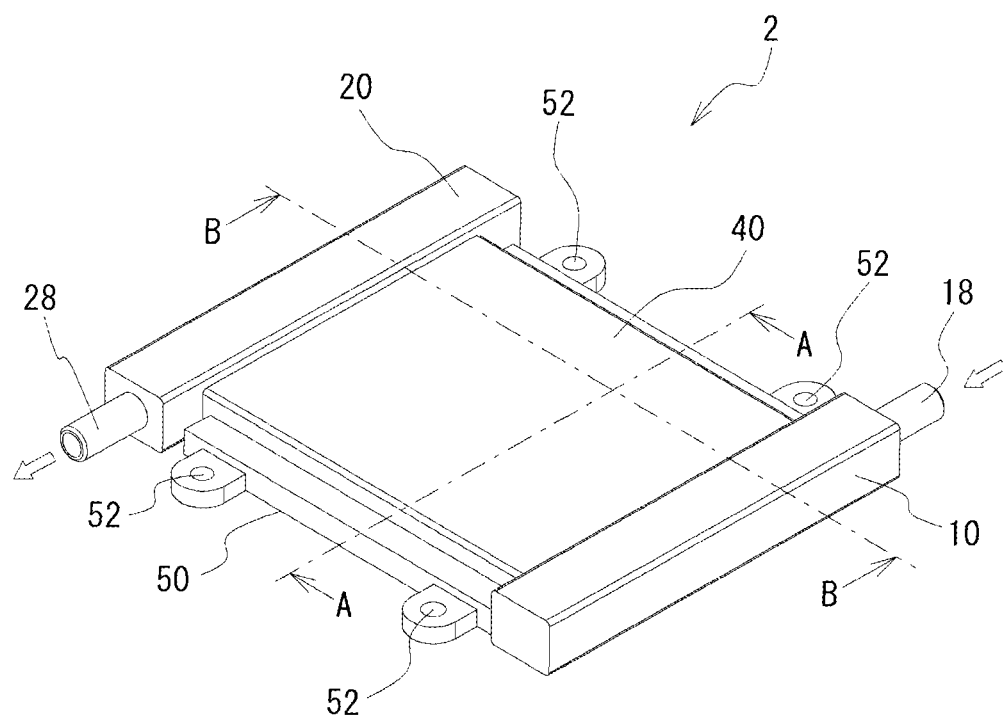
FIG. 2 is an explanatory view of a cooling jacket according to a first embodiment.

FIG. 2 is an explanatory view of the cooling jacket 2 according to the first embodiment. The cooling jacket 2 includes: a first pipe portion (hereinafter, referred to as pipe portion) 10, the second pipe portion (hereinafter, referred to as pipe portion) 20, a main portion 40, and a plate 50. The pipe portions 10 and 20 each have a tube shape, and the coolant flows therethrough. The main portion 40 is connected to side surfaces of the pipe portions 10 and 20. An inlet nozzle 18 is provided at an end of the pipe portion 10. An outlet nozzle 28 is provided at an end of the pipe portion 20. The inlet and outlet nozzles 18 and 28 are respectively connected by hoses.

The main portion 40 is formed with a single member, and defines a passageway through which the coolant flows. For example, the main portion 40 is made of a metal such as aluminum. The plate 50 is arranged below the main portion 40. The main portion 40 is arranged on the plate 50. For example, the plate 50 is formed with a metal with good heat conductivity such as aluminum or copper. The plate 50 is provided with screw holes 52 for securing the cooling jacket 2 to a printed circuit board or a metal frame.

Figure 3A:
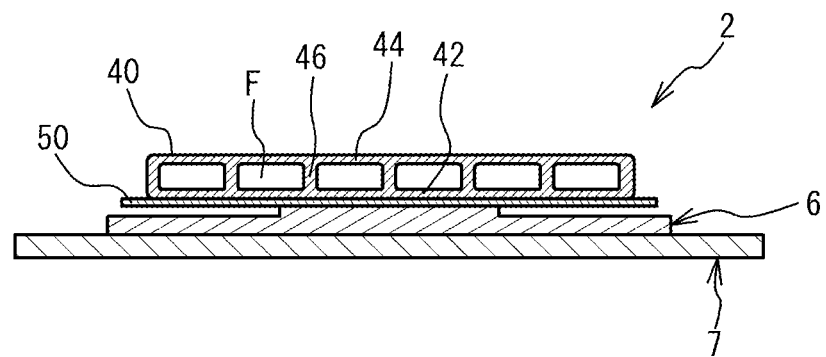
FIG. 3A is a sectional view taken along line A-A of FIG. 2.
Figure 3B:
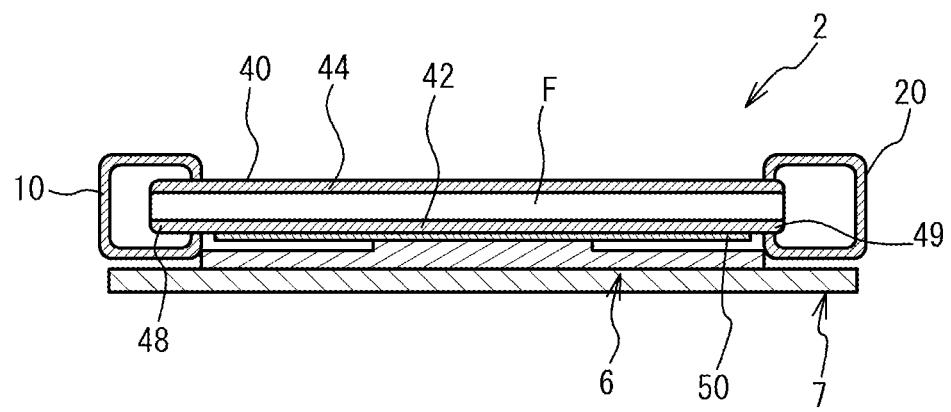
FIG. 3B is a sectional view taken along line B-B of FIG. 2.

FIG. 3A is a sectional view taken along line A-A of FIG. 2. FIG. 3B is a sectional view taken along line B-B of FIG. 2. The cooling jacket 2 is arranged to contact the heating part 6 mounted on a printed circuit board 7. The heat of the heating part 6 is transmitted to the main portion 40 through the plate 50. The coolant flows through the main portion 40 to transmit the heat quantity of the main portion 40 to the coolant. Therefore, the heating part 6 as an object to be cooled is cooled.

As illustrated in FIG. 3A, the main portion 40 includes: a lower wall 42; an upper wall 44 facing the lower wall 42; plural partition walls 46 provided between the lower and upper walls 42 and 44. Plural flow paths F are a defined by the lower wall 42, the upper wall 44, and plural partition walls 46. The lower wall 42, the upper wall 44, and the partition walls 46 are integrally formed with a single member. The partition wall 46 extends in a direction to the pipe portion 20 from the pipe portion 10. The coolant flows through the inlet nozzle 18, the pipe portion 10, the flow paths F of the main portion 40, the pipe portion 20, and the outflow nozzle 28, in this order. The pipe portions 10 and 20 are provided with oblong holes extending in their axial directions, respectively. Ends 48 and 49 of the main portion 40 are respectively inserted into these oblong holes.

Figure 4A:
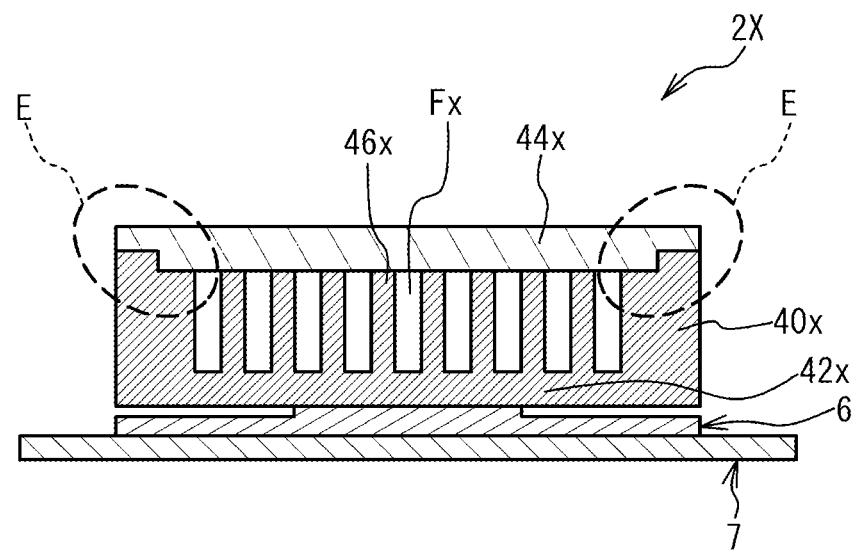
FIG. 4A is a sectional view of a cooling jacket having a structure different from that of the present embodiment.

A description will be given of a cooling jacket 2X having a structure different from that of the present embodiment. FIG. 4A is a sectional view of the cooling jacket 2X having a structure different from that of the present embodiment. The cooling jacket 2X includes a main portion 40x, and a cover 44x covering the main portion 40x. The main portion 40x is provided with plural fins 46x protruding upwardly from a lower wall 42x. The cover 44x is secured to the main portion 40x to contact the ends of the fins 46x. In this way, plural flow paths Fx are defined. Since the flow paths Fx are defined by two members of the main portion 40x and the cover 44x, the following problem may be generated.

Figure 4B:
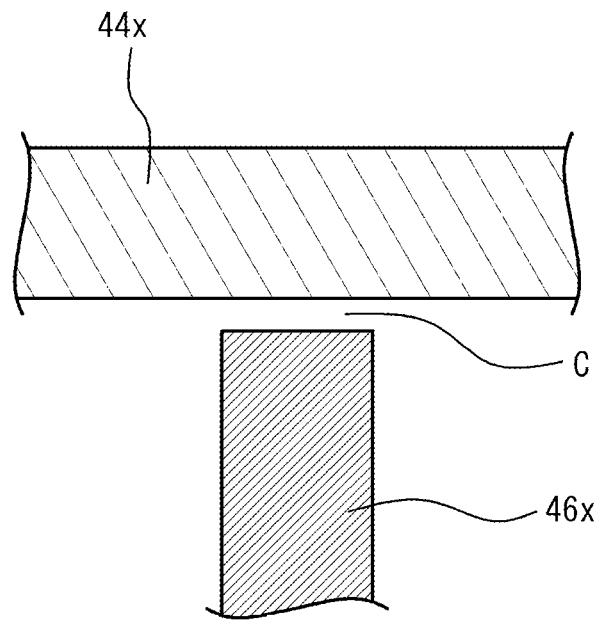
FIG. 4B is a partially enlarged view of FIG. 4A.

As illustrated in FIG. 4B, a gap C might be generated between the cover 44x and ends of the fins 46x, and the coolant might flow through this gap C. Accordingly, the quantity of the coolant originally flowing between the fins 46x might decrease, and the cooling efficiency might decrease. Further, the cover 44x might be expanded outwardly by the rise of the inner pressure to enlarge the gap C. Furthermore, it is necessary to ensure edges E to be applied with a bonding agent such as a wax material in order to join two members of the main portion and the cover 44x as illustrated in FIG. 4A. The wax materials are applied to the edges E to join the cover 44x and the main portion 40x. Therefore, the size of the cooling jacket 2X is increased only by the edges E.

However, in the cooling jacket 2 according to the first embodiment, the main portion 40 is formed with a single member, thereby solving the above problems. Additionally, a bonding agent such as a wax material is unnecessary for joining two members, whereby the main portion 40 is downsized.

Figure 5A:
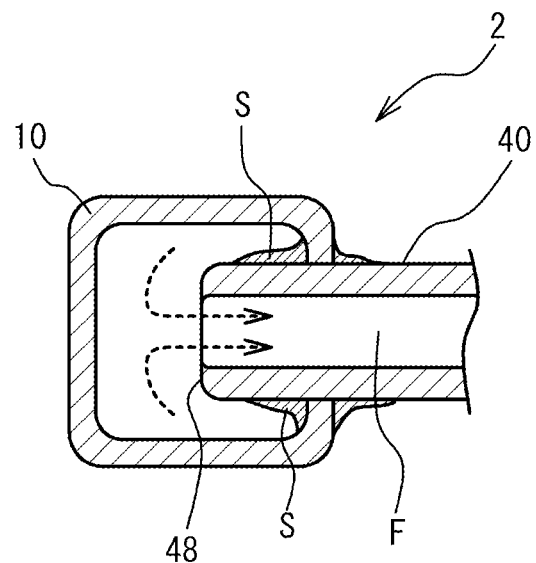
FIG. 5A is an enlarged view of a periphery of a pipe portion illustrated in FIG. 3.

FIG. 5A are enlarged views of the periphery of the pipe portion 10 of FIG. 3B. The pipe portion 10 and the main portion 40 are fixed with a bonding agent such as a wax material. Specifically, the end 48 of the main portion 40 is inserted into an oblong hole provided in the pipe portion 10, and then a bonding agent such as a wax material is applied to the border between the pipe portion 10 and the main portion 40 to joint them. As illustrated in FIG. 5A, the end 48 of the main portion 40 is deeply inserted into the inside of the pipe portion 10 from the inner surface thereof. This reason is explained as follows. The bonding agent such as a wax material applied to the gap between the pipe portion 10 and the main portion 40 may flow over the main portion 40 and reach the inside of the pipe portion 10 and then become hard. FIG. 5A illustrates the bonding agent S such as a wax material that has become hard within the pipe portion 10. In light of the amount of the leakage of the bonding agent S such as a wax material, the end 48 is deeply inserted to the inside of the pipe portion 10 from the inner surface thereof.

Figure 5B:
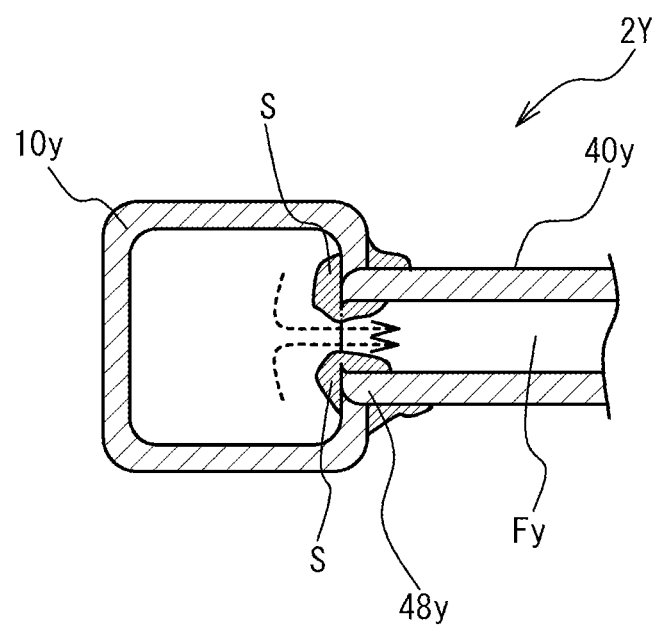
FIG. 5B is an enlarged view of a periphery of a pipe portion of a cooking jacket having a structure different from that of the present embodiment.

FIG. 5B is an enlarged view of the periphery of a pipe portion 10y of a cooling jacket 2Y having a structure different from that of the present embodiment. As illustrated in FIG. 5B, when the cooling jacket 2Y is compared with the cooling jacket 2 according to the embodiment, an end 48y of the main portion 40Y is not deeply inserted to the inside of the pipe portion 10y. For this reason, the bonding agent S such as a wax material which is leaked from a gap between the pipe portion 10y and the main portion 40y becomes hard in the periphery of the border between the inner surface of the pipe portion 10y and an end face of the end 48y. Thus, when the bonding agent S such as a wax material hardens on the inner surface of the pipe portion 10y, the bonding agent S such as a wax material might be exposed to the coolant to be partially peeled off. Thus, the bonding agent S may flow in the coolant. This might cause the passageways of the coolant and the pump to be clogged. This also might deteriorate the joining strength between the pipe portion 10y and the main portion 40y.

However, in the cooling jacket 2 according to the first embodiment, the end 48 is deeply inserted into the inside of the pipe portion 10 from the inner surface thereof in light of the amount of the leakage of the bonding agent S such as a wax material, as illustrated in FIG. 5A. Therefore, the bonding agent S such as a wax material leaked from the gap between the pipe portion 10 and the main portion becomes hard at a position be hardly exposed to the coolant. This suppresses the peeling of the bonding agent S such as a wax material from the end 48. Likewise, the end 49 of the main portion 40 is more deeply inserted to the inside of the pipe portion 20 than the inner surface thereof.

Figure 6A:
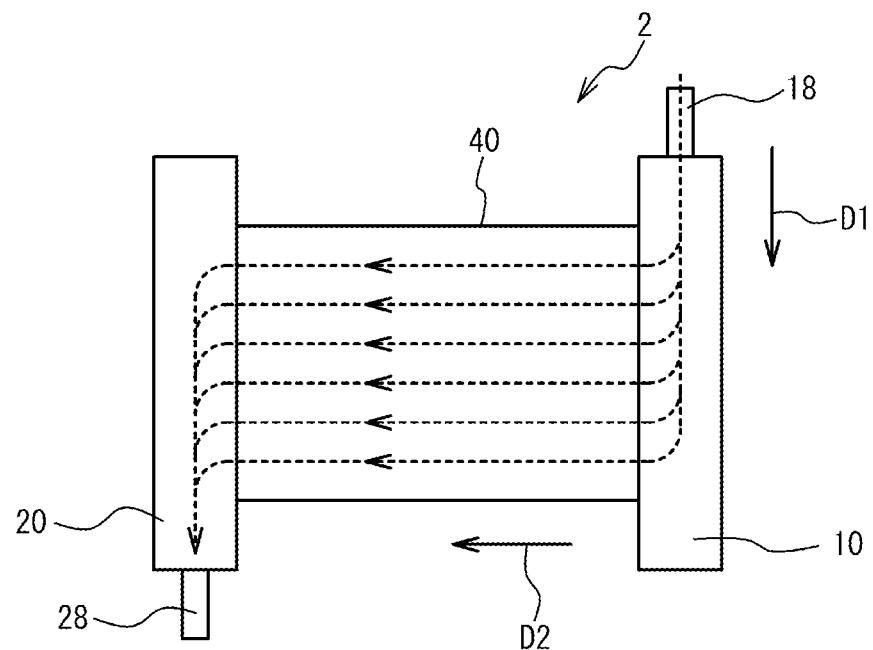
FIG. 6 is a front view of the cooling jacket according to the present embodiment.
FIG. 6B is a front view of a cooling jacket having a structure different from that of the present embodiment.

Next, the flow of the coolant will be described. FIG. 6A is a front view of the cooling jacket 2 according to the present embodiment. Additionally, FIG. 6A is simplified. A flowing direction D1 of the coolant flowing into the inlet nozzle 18 is the axial direction of the pipe portion 10. The coolant which has flowed into the pipe portion 10 flows therefrom into the main portion 40. The coolant flows through the main portion 40 in a direction D2 substantially orthogonal to the direction D1. Thus, the direction D1 in which the coolant flows into the pipe portion 10 is different from the direction D2 in which the coolant flows through the main portion 40. Specifically, the directions D1 and D2 are substantially orthogonal to each other.

Figure 6B:
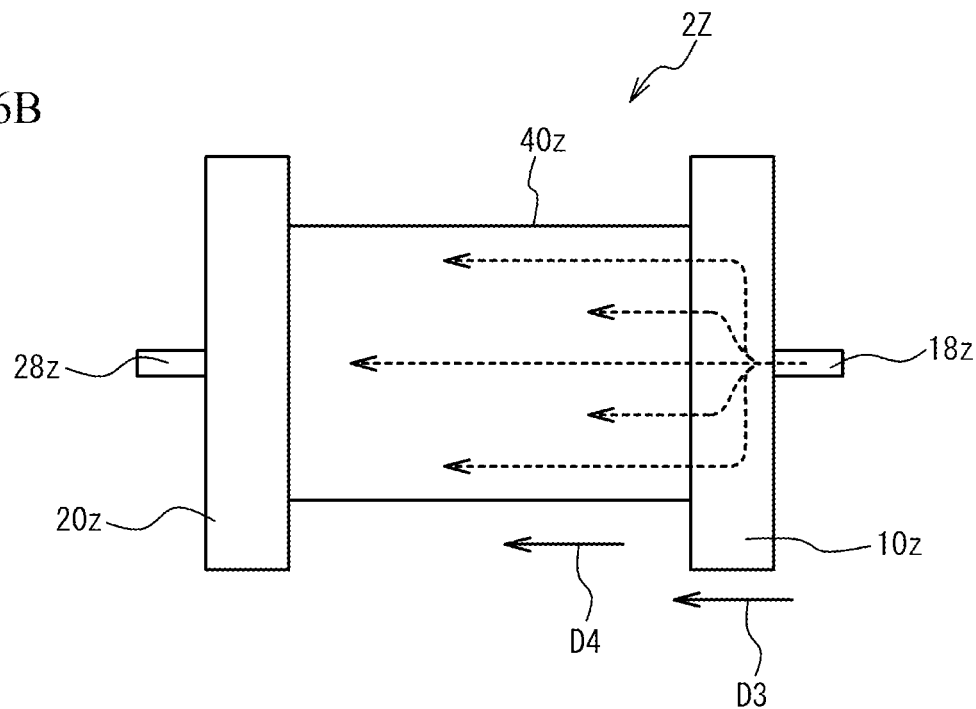

FIG. 6B is a front view of the cooling jacket 2Z having a structure different from that according to the present embodiment. Pipe portions 10z and 20z are respectively provided with both ends of a main portion 40z. An inlet nozzle 18z is provided at a substantial center of a side surface of the pipe portion 10z. Likewise, an outlet nozzle 28z is provided at a substantial center of a side surface of the pipe portion 20z. A direction D3 in which the coolant flows into the pipe portion 10z from the inlet nozzle 18z is substantially orthogonal to an axial direction of the pipe portion 10z. The coolant which has flowed from the inlet nozzle 18z through the pipe portion 10z spreads toward its end to flow into the main portion 40z. The coolant flows through the main portion 40z in a direction D4. In this way, in the cooling jacket 2Z, the direction D3 in which the coolant flows into the pipe portion 10z is substantially identical to the direction D4 in which the coolant flows through the main portion 40z.

The main portion 40 is also provided with plural fins arranged in the direction in which the coolant flows therethrough. A part of the coolant flowing through the pipe portion 10z flows from the inlet nozzle 18z through the center of the pipe portion 10z in a linear way without receiving a large resistance. Also, when another part of the coolant flowing through the pipe portion 10z flows into the main portion 40z from the pipe portion 10z, the above another part of the coolant contacts the fins to flow into both sides of the main portion 40z. The remaining part of the coolant flowing through the pipe portion 10z flows between the center and the ends of the pipe portion 10z. Thus, the most part of the coolant flowing through the main portion 40z flows through the center and the ends of the main portion 40z. Accordingly, the coolant does not flow uniformly through the whole main portion 40z. This might deteriorate the cooling efficiency.

However, in the cooling jacket 2 according to the first embodiment, the direction D1 in which the coolant flows into the pipe portion 10 is the axial direction of the pipe portion 10, and the direction D1 in which the coolant flows into the pipe portion 10 is different from the direction D2 in which the coolant flows through the main portion 40. This enables the coolant to flow uniformly through the whole main portion 40. Therefore, the deterioration of the cooling efficiency is suppressed. Additionally, for example, the direction D1 in which the coolant flows into the pipe portion 10 and the direction D2 in which the coolant flows through the main portion 40 are not limited to orthogonal. For example, the directions D1 and D2 have only to be intersected with each other.

Additionally, a direction in which the coolant flows into the pipe portion 10 is the same as a direction in which the coolant flows out of the pipe portion 20.

Figure 7A:
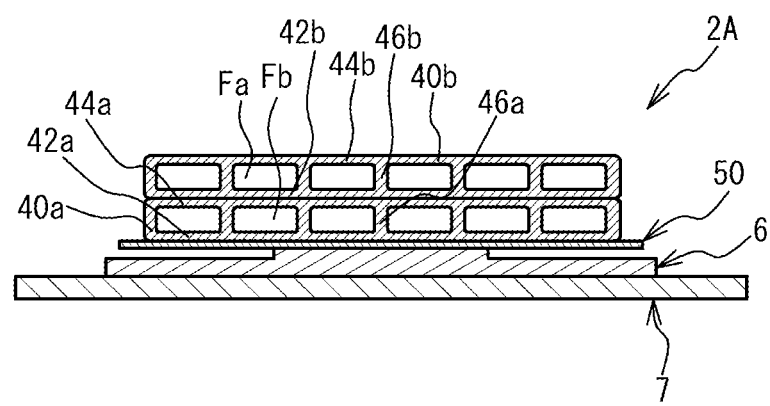
FIGS. 7A and 7B are explanatory views of the cooling jacket according to a variation of the first embodiment.
Figure 7B:
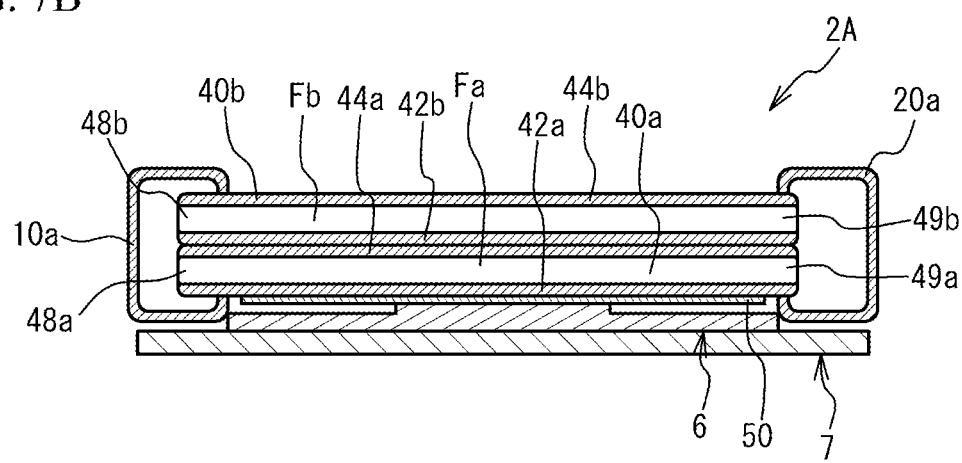

Next, a variation of the first embodiment will be described. FIGS. 7A and 7B are explanatory views of a cooling jacket 2A according to the variation of the first embodiment. FIGS. 7A and 7B respectively correspond to FIGS. 3A and 3B.

The cooling jacket 2A includes two main portions 40a and 40b. Each of the main portions 40a and 40b is made of a single member. The main portions 40a and 40b are stacked to each other in the vertical direction. The main portion 40a is arranged at the side of the heating part 6, and the main portion 40b is arranged to contact the upper portion of the main portion 40a. The coolant flows from a pipe portion 10a through both flow pathes Fa and Fb of the main portions 40a and 40b into the pipe portion 20a, respectively.

The provision of two main portions 40a and 40b ensures the contact area between the coolant and the main portions 40a and 40b. This improves the cooling efficiency. Also, air bubbles flowing through the main portion 40b can be prevented from moving to the main portion 40a. This suppresses the deterioration of the cooling efficiency caused by air bubbles flowing through the main portion 40a. Moreover, ends 48a and 48b of the main portions 40a and 40b are more deeply inserted to the inside of the pipe portion 10a than the inner surface thereof. Likewise, ends 49a and 49b are more deeply inserted to the inside of the pipe portion 10b than the inner surface thereof.

Second Embodiment

Figure 8A:
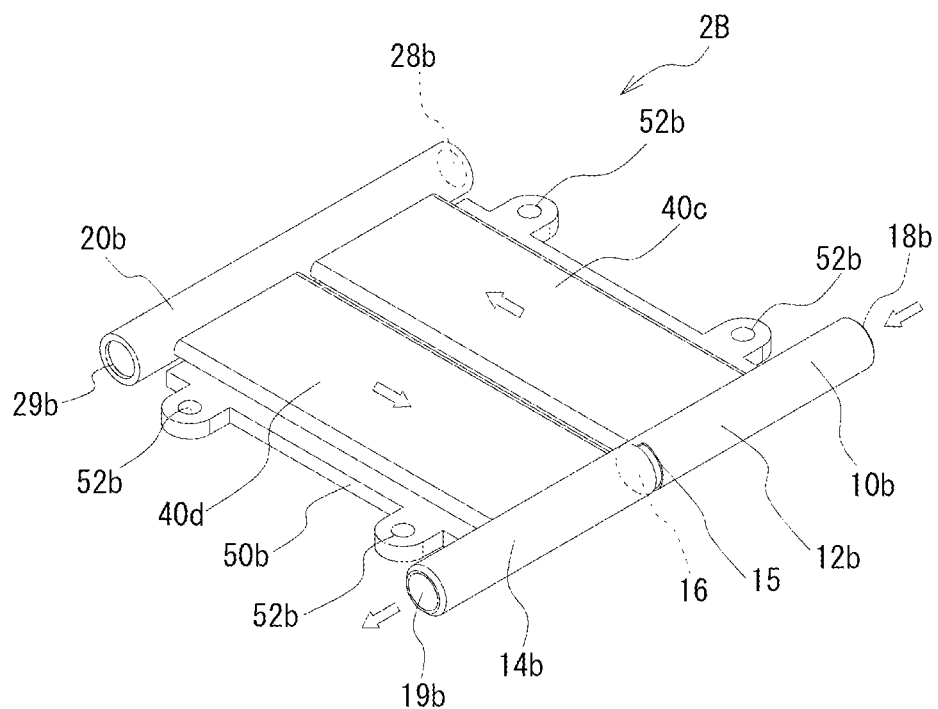
FIGS. 8A and 8B are explanatory views of a cooling jacket according to a second embodiment.
Figure 8B:
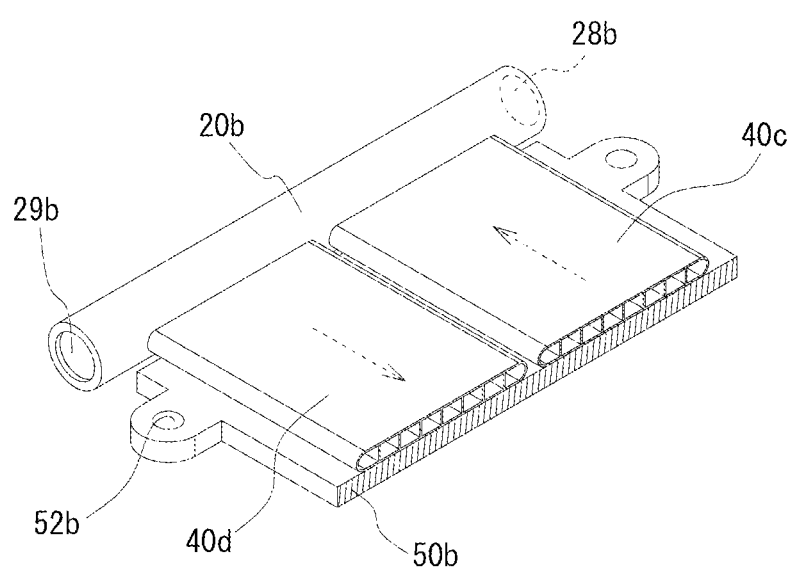
Figure 9:
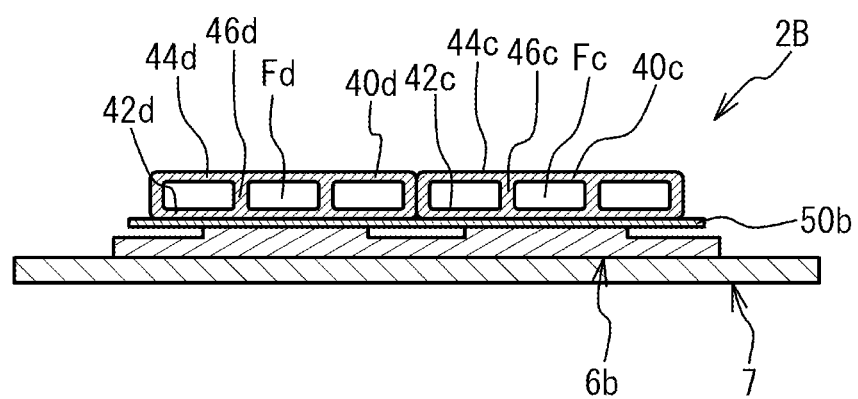
FIG. 9 is a sectional view of the cooling jacket according to the second embodiment.

FIGS. 8A and 8B are explanatory views of a cooling jacket 2B according to the second embodiment. FIG. 8A is a perspective views of the cooling jacket 2B, and FIG. 8B is a cutout view of the cooling jacket 2B. FIG. 9 is a sectional view of the cooling jacket 2B according to the second embodiment, and corresponds to FIG. 3A. Additionally, the components similar to those of the cooling jacket 2 according to the first embodiment are designated by the same reference numerals, and a duplicate description will be omitted.

The cooling jacket 2B includes pipe portions 10b and 20b, and main portions 40c and 40d. The pipe portion 10b includes: a supplying portion 12b; a collecting portion 14b; a partition plate 16 partitioning the supplying portion 12b and the collecting portion 14b. The partition plate 16 is inserted into a slit 15 formed in the pipe portion 10b to be fixed thereto by a bonding agent such as a wax material. The pipe portion 10b is provided at its one end with an inlet 18b and at its other end with an outlet 19b. The pipe portion 20b is provided at its both ends with seal portions 28b and 29b, respectively. The main portion 40c includes one end connected with the supplying portion 12b and the other end connected with the pipe portion 20b. The supplying portion 12b causes the coolant to flow into the main portion 40c. As for a main portion 40d, an end is connected with the pipe portion 20b, the other end is connected with the collecting portion 14b. A coolant flows from the main portion 40d into the collecting portion 14b.

The main portions 40c and 40d are aligned in the horizontal direction. The coolant flows through the inlet 18b, the supplying portion 12b, the main portion 40c, the pipe portion 20b, the main portion 40d, the collecting portion 14b, and the outlet 19b, in this order. The coolant flows from the main portion 40c through the pipe portion 20b into the main portion 40d. The pipe portion 20b functions to transfer the coolant from the main portion 40c to the main portion 40d.

The cooling jacket 2B includes two main portions 40c and 40d, thereby increasing the flow rate of the coolant flowing through each of the main portions 40c and 40d. This improves the cooling efficiency.

Figure 10:
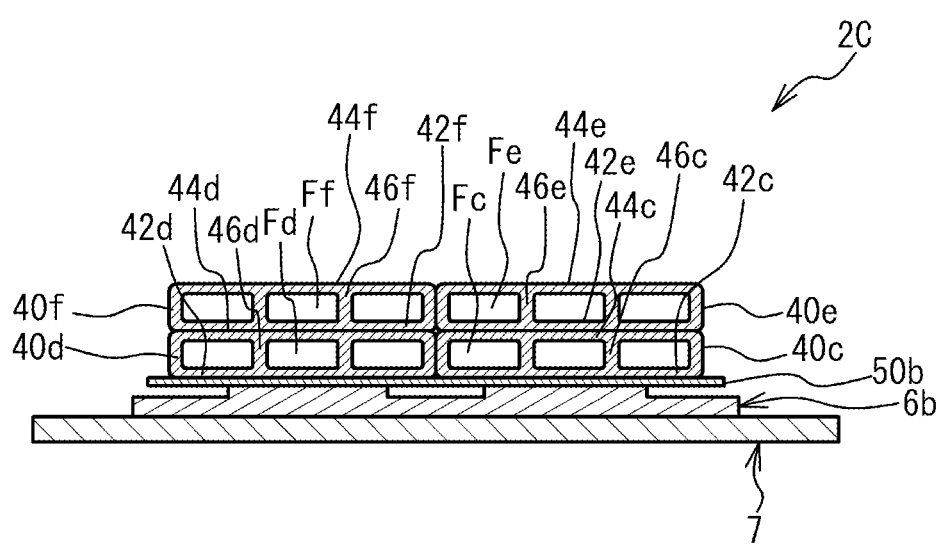
FIG. 10 is an explanatory view of a variation of the second embodiment.

Next, a variation of the second embodiment will be described. FIG. 10 is an explanatory view of a cooling jacket 2C according to the variation of the second embodiment. FIG. 10 corresponds to FIG. 9. Main portions 40e and 40f are arranged on the upper surfaces of the main portions 40c and 40d, respectively. As for the main portion 40e, one end is connected with the supplying portion 12b, and the other end is connected with the pipe portion 20b. As for the main portion 40f, one end is connected with the pipe portion 20b, the other end is connected with the collecting portion 14b. The coolant flows from the supplying portion 12b through both main portions 40c and 40e. Also, the coolant flows from the pipe portion 20b through both main portions 40d and 40f.

This ensures the contact area between the coolant and the main portions 40c to 40f, and increases the flow rate of the coolant flowing through each of the main portions 40c to 40f. This improves the cooling efficiency.

All examples and conditional language recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to a showing of the superiority and inferiority of the invention. Although the embodiment of the present inventions has been described in detail, it should be understood that the various changes, substitutions, and alterations could be made hereto without departing from the sprit and scope of the invention.

What is claimed is:

1. A cooling jacket, comprising:
   first and second pipe portions through which a coolant flows;
   a main portion connected with side surfaces of the first and second pipe portions, defining, with a single member, a flow path through which the coolant flows, and cooling an object to be cooled;
   wherein the first pipe portion and the main portion are fixed with a bonding agent which is hardened,
   wherein an end of the main portion is inserted into an inside of the first pipe portion, beyond an inner surface of the first pipe portion,
   wherein the first pipe portion includes an inner surface and an outer surface,
   wherein the main portion includes an inner surface and an outer surface, and
   wherein the bonding agent includes:

a first bonding agent portion bonding the inner surface of the first pipe portion and an upper surface of the outer surface of the main portion, a second bonding agent portion bonding the outer surface of the first pipe portion and the upper surface of the outer surface of the main portion, a third bonding agent portion bonding the inner surface of the first pipe portion and a lower surface of the outer surface of the main portion, and a fourth bonding agent portion bonding the outer surface of the first pipe portion and the lower surface of the outer surface of the main portion, wherein the upper surface and the lower surface of the outer surface of the main portion are positioned at a distance from the inner surface of the first pipe, and wherein the first bonding agent portion and the third bonding agent portion do not leak into the inner surface of the main portion.

2. The cooling jacket of claim 1, wherein a direction in which the coolant flows into the first pipe portion is an axial direction of the first pipe portion, and wherein the direction in which the coolant flows into the first pipe portion is different from a direction in which the coolant flows through the main portion.

3. An electronic device comprising a cooling jacket, the cooling jacket comprising:

first and second pipe portions through which a coolant flows; and a main portion connected with side surfaces of the first and second pipe portions, defining, with a single member, a flow path through which the coolant flows, and cooling an object to be cooled;

wherein the first pipe portion and the main portion are fixed with a bonding agent which is hardened, wherein an end of the main portion is inserted into an inside of the first pipe portion, beyond an inner surface of the first pipe portion, wherein the first pipe portion includes an inner surface and an outer surface, wherein the main portion includes an inner surface and an outer surface, and wherein the bonding agent includes:

a first bonding agent portion bonding the inner surface of the first pipe portion and an upper surface of the outer surface of the main portion, a second bonding agent portion bonding the outer surface of the first pipe portion and the upper surface of the outer surface of the main portion, a third bonding agent portion bonding the inner surface of the first pipe portion and a lower surface of the outer surface of the main portion, and a fourth bonding agent portion bonding the outer surface of the first pipe portion and the lower surface of the outer surface of the main portion, wherein the upper surface and the lower surface of the outer surface of the main portion are positioned at a distance from the inner surface of the first pipe, and wherein the first bonding agent portion and the third bonding agent portion do not leak into the inner surface of the main portion.

4. The cooling jacket of claim 1, wherein at least a part of the main portion is exposed.

5. The cooling jacket of claim 1, wherein the end of the main portion is located within the first pipe portion and does not contact the inner surface of the first pipe portion.

6. The cooling jacket of claim 1, wherein the bonding material is a wax material.

7. The cooling jacket of claim 1, wherein the coolant flows through the first pipe portion, the main portion and the second pipe portion, in this order, and wherein a depth of the end of the main portion inserted into the inside of the first pipe portion is greater than a depth of another end of the main portion inserted into an inside of the second pipe portion.

* * * * *